United States Patent
Fujii

(10) Patent No.: US 7,358,815 B2
(45) Date of Patent: Apr. 15, 2008

(54) MONOLITHIC TRANSFORMER BASED AMPLIFIER FOR INTEGRATED CIRCUITS

(75) Inventor: Kohei Fujii, San Jose, CA (US)

(73) Assignee: Avago Technologies Wireless IP Pte Ltd, Singapore (SG)

( * ) Notice: Subject to any disclaimer, the term of this patent is extended or adjusted under 35 U.S.C. 154(b) by 166 days.

(21) Appl. No.: 11/173,378

(22) Filed: Jul. 2, 2005

(65) Prior Publication Data

US 2007/0001765 A1    Jan. 4, 2007

(51) Int. Cl.
   *H03F 3/26* (2006.01)
(52) U.S. Cl. ............. 330/276; 330/301; 333/26
(58) Field of Classification Search ......... 330/276, 330/301
   See application file for complete search history.

(56) References Cited

U.S. PATENT DOCUMENTS

| | | | | |
|---|---|---|---|---|
| 3,911,372 A | * | 10/1975 | Seidel | 330/286 |
| 5,304,959 A | * | 4/1994 | Wisherd et al. | 333/26 |
| 6,040,745 A | * | 3/2000 | Tanaka et al. | 333/26 |
| 6,107,885 A | * | 8/2000 | Miguelez et al. | 330/276 |
| 6,278,340 B1 | * | 8/2001 | Liu | 333/26 |
| 6,586,999 B2 | * | 7/2003 | Richley | 330/276 |
| 6,982,609 B1 | * | 1/2006 | McKay et al. | 333/25 |
| 7,068,104 B2 | * | 6/2006 | Burns et al. | 330/253 |

\* cited by examiner

*Primary Examiner*—Benny Lee
*Assistant Examiner*—Alan Wong

(57) ABSTRACT

Monolithic transformer based amplifier for integrated circuits. The amplifier includes an input transformer with a first impedance transforming ratio. The input transformer includes a coupled line structure. An amplification circuit is coupled to the input transformer. The amplifier also includes an output transformer with a second impedance transforming ratio that is coupled to the amplification circuit.

16 Claims, 4 Drawing Sheets

MONOLITHIC TRANSFORMER BASED AMPLIFIER FOR INTEGRATED CIRCUITS

BACKGROUND OF THE INVENTION

Radio communications are important and prevalent in today's society. For example, handsets or cell phones are commonplace in society. The handsets are equipped with an antenna that sends outgoing signals and receives incoming signals. One important element in the handset is a power amplifier that is typically connected to the antenna. The power amplifier is utilized to receive radio signals (e.g., signals representing voice or sound) and to amplify these signals to a level suitable for transmission through the antenna. Cell phones typically operate at frequencies in the range between 1 GHz and 2 GHz.

As the size of the applications decreases, there is a need for the components of such applications to decrease. Consequently, the size of the amplifier needs to be decreased. One proposed approach is to shrink the size of the amplifier so that it can fit in a monolithic microwave integrated circuit (MMIC). The typical size of a MMIC is 3 mm by 3 mm by 50 micrometers. As can be appreciated, this size constraint places design restrictions on the type of sub-components that can be utilized in the design of the amplifiers.

For example, many amplifiers, where size is not a constraint, utilizes transformers that are manufactured from a toroid core. Unfortunately, these cores have a minimum physical dimension or size that is much larger than integrated circuit technology and packaging technology for MMICs and the size requirements stated previously. Consequently, current amplifier designs and components are contrary to and militates against the trend to decrease the size of electronic devices and components.

Stated differently the large area required by existing components make such an implementation unsuitable for miniature power amplifiers for MMIC applications. In this regard, there remains the technical hurdle of developing designs and components for amplifiers that are conducive for space-efficient designs.

Based on the foregoing, there remains a need for a mechanism to reduce the size or area occupied by the amplifier so that the amplifier can be utilized in miniature, space conserving applications and to further overcome the disadvantages set forth previously.

SUMMARY OF THE INVENTION

According to one embodiment of the present invention, a monolithic transformer based amplifier for integrated circuits, such as microwave monolithic integrated circuits (MMICs). The amplifier includes an input transformer with a first impedance transforming ratio. The input transformer includes a coupled line structure. An amplification circuit is coupled to the input transformer. The amplifier also includes an output transformer with a second impedance transforming ratio that is coupled to the amplification circuit.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION

A monolithic transformer based amplifier for integrated circuits is described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Monolithic Transformer Based Amplifier 100

Figure 1:
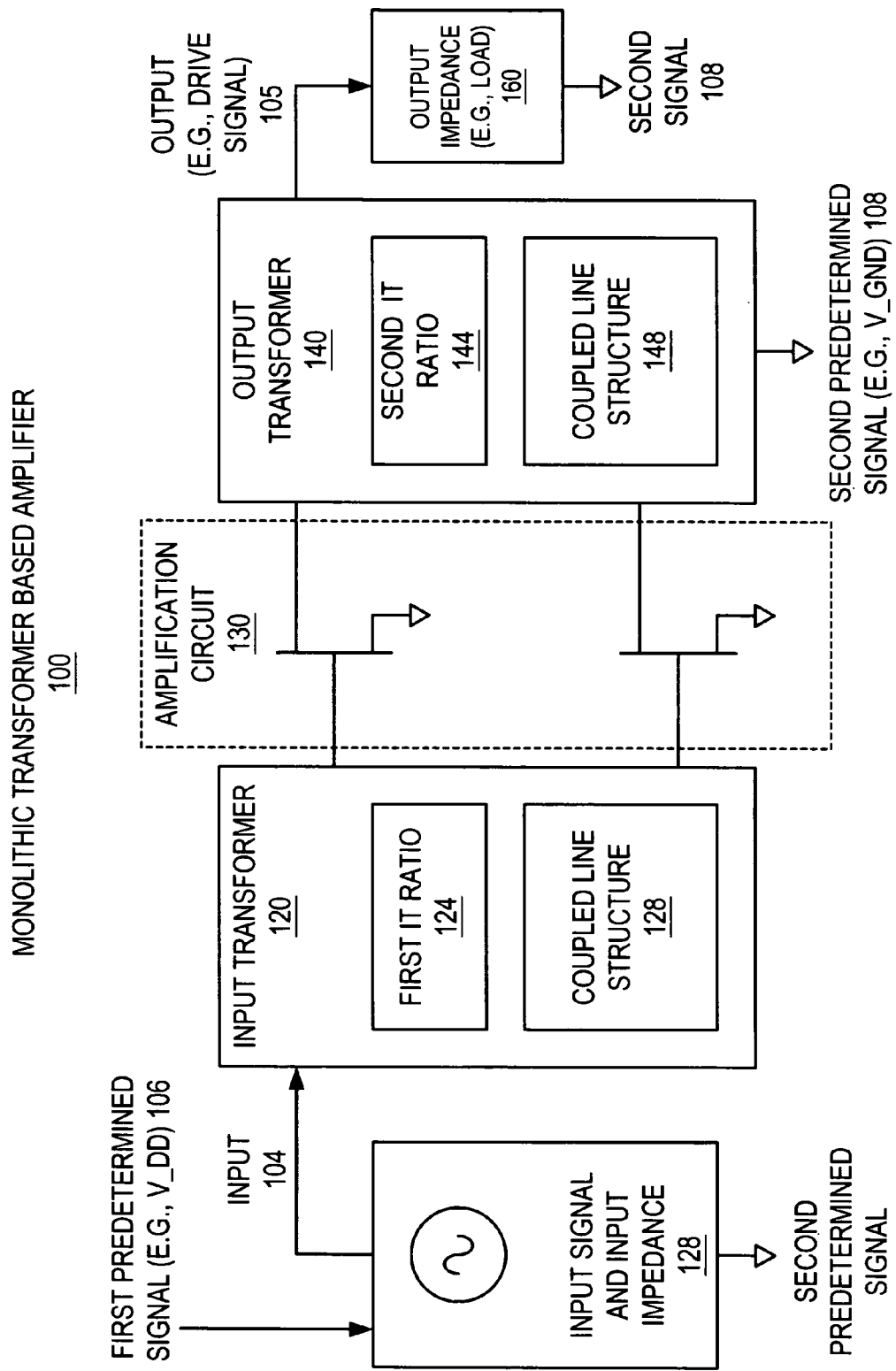
FIG. 1 illustrates a block diagram of an amplifier according to one embodiment of the invention.

FIG. 1 illustrates a block diagram of an amplifier 100 according to one embodiment of the invention. In one embodiment, the amplifier 100 has a balanced power amplifier architecture. According to one embodiment of the invention, the amplifier 100 is implemented in an integrated circuit, such as a monolithic microwave integrated circuit (MMIC) that operate in the microwave and mm-wave frequency range.

The amplifier 100 includes an input for receiving an input signal 104 (e.g., a radio frequency (RF) signal, RF_in) and provides a drive signal 105 (e.g., a drive current) to a load (R_L) 160, which can be, for example, an antenna (e.g., a 50 ohm antenna). The input signal 104 is generated by a signal generator 128 that includes an input impedance.

The amplifier 100 also includes an input transformer 120 that performs impedance transformation. The input transformer 120 includes a first impedance transformation ratio 124 and includes a coupled line structure 128. In one embodiment, the amplifier 100 includes a coupled line based input transformer that performs impedance transformation according to a predetermined impedance transformation ratio (e.g., a 1 to 4 ratio). In this manner, the input impedance seen by the amplification circuit 130 may be adjusted to match a predetermined input impedance. The input transformer 120 also converts a single ended output of the input source into a balanced input for the amplification circuit 130.

The power amplifier architecture 100 also includes an amplification circuit 130 that is coupled to the input transformer 120. The amplifier 100 also includes an output transformer 140 that performs impedance transformation that is coupled to the amplification circuit 130. The output transformer 140 includes a second impedance transformation ratio 144 and includes a coupled line structure 148.

In one embodiment, the amplification circuit 130 includes a first amplifier and a second amplifier to create a balanced amplifier structure as described in greater detail hereinafter with reference to FIG. 2. The first amplifier includes an input that is coupled to the first signal path to receive the first signal. The second amplifier includes an input that is coupled to the second signal path to receive the second signal. Bias circuitry (not shown) may be provided to bias the amplifiers. The amplifiers can be single stage amplifiers or a multi-stage amplifiers. In one embodiment, the amplifiers may be implemented with a field effect transistors (FETs), such as GaAs FETs.

The balanced power amplifier 100 includes a power combiner 140 with integrated phase shifter 144 (also referred to as a phase delay mechanism). The power combiner 140 includes two inputs and one input. The first input is coupled to receive the signal generated by the first amplifier 132. The second input is coupled to receive the signal generated by the second amplifier 134. The power combiner 140 combines the power of signal received by the first input with the power of the signal received by the second input and generates an output signal with the combined power.

By using micro strip technology to implement different components of the amplifier according to the invention, space savings and space reduction may be realized. Moreover, the miniaturization of the transformers according to the invention enables the realization of a monolithic amplifier without the need for bulky ferrite cores.

It is noted that one or more of the components or functions may be implemented as lumped elements or traces disposed on the printed circuit board, or as lumped elements disposed in one or more integrated circuit. It is noted that the components may be packaged in a single integrated circuit or distributed across two or more integrated circuits.

It is noted that a first predetermined signal (e.g., V_DD signal) 106 and a second predetermined signal 108 (e.g., a ground signal) are provided to various components (e.g., the transformer 120, the amplification circuit 130, and the output transformer 140) of the amplifier 100. In one embodiment, the predetermined signal 106 is a power supply voltage signal that is in the range of about 2.5V to about 7V, and the second predetermined signal 108 is a ground potential signal.

Coupled Line Implementation

Figure 2:
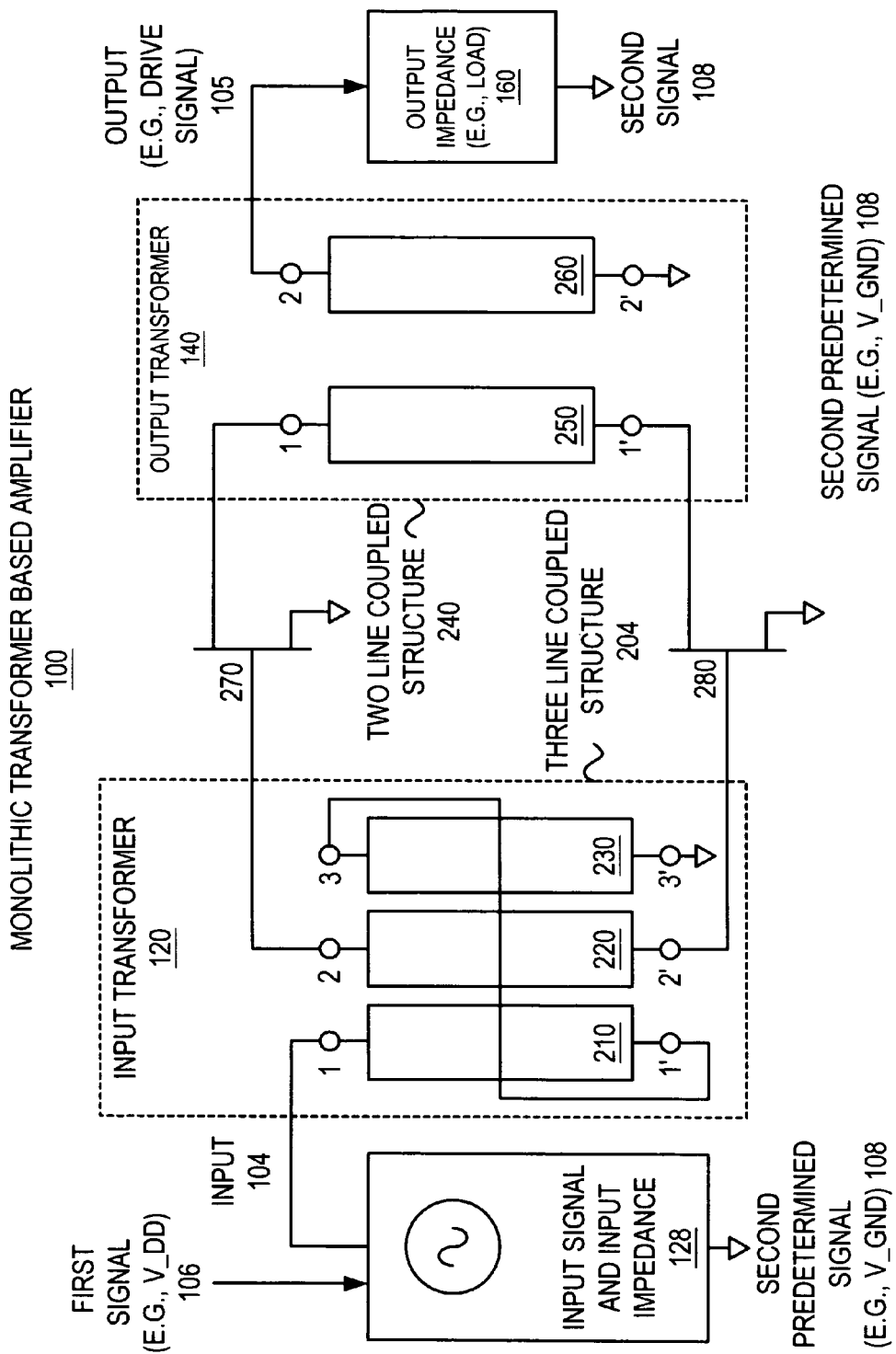
FIG. 2 illustrates the amplifier of FIG. 1 in which the transformers are implemented with coupled line structures according to one embodiment of the invention.

FIG. 2 illustrates the amplifier of FIG. 1 in which the transformers are implemented with coupled line structures according to one embodiment of the invention. The input transformer 120 includes a three line coupled line structure 204 that includes a first line 210, a second line 220, and a third line 230. For example, the coupled line structure can be implemented with micro strip technology. The coupled line structure can be a planar structure. Two examples of a planar structure are a side-by-side configuration and a broadside configuration.

In a first embodiment, lines 210, 220, 230 have a side-by-side configuration and are arranged in a side-by-side fashion and in a first plane as shown in FIG. 2. In this side-by-side configuration or structure, the lines 210, 220, 230 are arranged to be disposed generally in a single plane (e.g., the plane of the figure), and the lines 210, 220, 230 are coupled in this plane.

Figure 4:
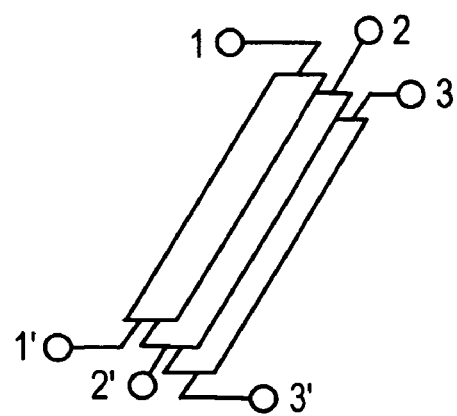
FIG. 4 illustrates a three-line broadside coupling transformer that can be utilized to implement the input transformers of FIG. 2 according to one embodiment of the invention.

In another embodiment, the lines are arranged in a broadside configuration in which the first line, second line, and the third line are arranged in different planes (e.g., a broadside configuration). FIG. 4 illustrates a three-line broadside coupling transformer that can be utilized to implement the input transformer of FIG. 2 according to one embodiment of the invention.

In this case, the coupling is "broadside" or along a z direction (e.g., into the page or out of the page). It is noted that in one embodiment, the first line, second line, and third line are stacked in a manner in which the projections of the lines onto the plane of the third line are generally coincident with the outline of the third line. In another embodiment, the first line, second line, and third line are arranged in a manner in which at least one of the lines is offset with respect to at least one of the other lines as shown in FIG. 4.

The output transformer 140 includes a two-line coupled line structure 240 that includes a first line 250 and a second line 260. For example, the coupled line structure can be implemented with micro strip technology. The first line 250 and the second line 260 can be arranged in a planar fashion as shown. In the planar structure, the lines are arranged to be disposed generally in a single plane (e.g., the plane of the figure), and the lines are coupled in this plane.

Figure 3:
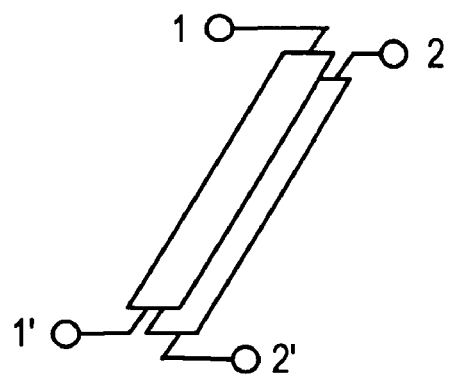
FIG. 3 illustrates a two-line broadside coupling transformer that can be utilized to implement the output transformer of FIG. 2 according to one embodiment of the invention.

The lines 250, 260 can also be arranged in a broadside configuration in which the first line and second line are arranged in different planes (e.g., a broadside configuration). FIG. 3 illustrates a two-line broadside coupling transformer that can be utilized to implement the output transformer of FIG. 2 according to one embodiment of the invention.

In this case, the coupling is "broadside" or along a z direction (e.g., into the page or out of the page). It is noted that in one embodiment, the first line and second line are stacked in a manner in which the projection of the first line on the plane containing the second line is generally coincident with the outline of the second line. In another embodiment, the first line and second line are arranged in a manner in which at least one of the lines is offset with respect to at least one of the other lines as shown in FIG. 3.

The amplification circuit 130 can be implemented with a first transistor 270 and a second transistor 280. The transistors 270, 280 can be implemented with field effect transistors (FETs), such as GaAs FETs.

Figure 5:
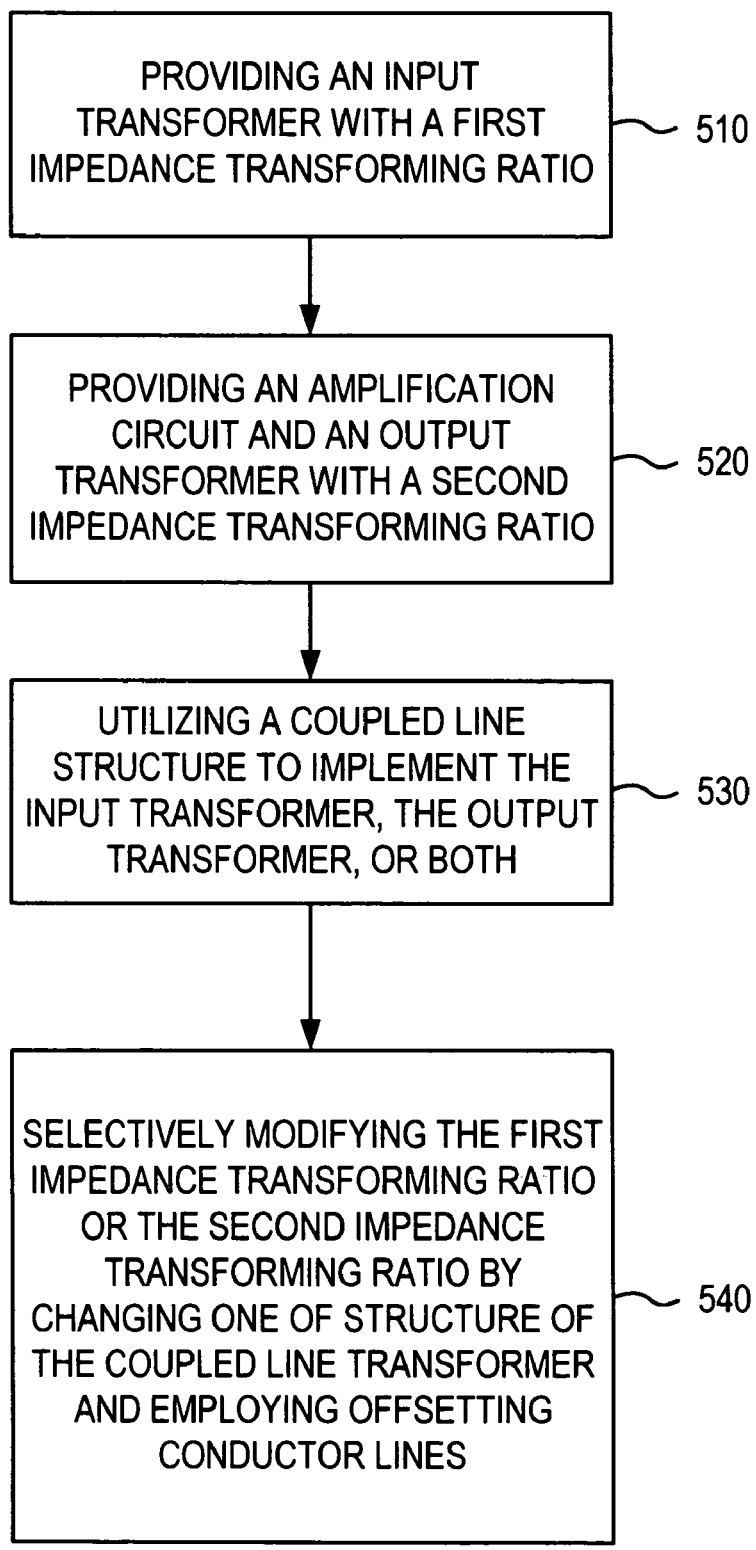
FIG. 5 illustrates a method of manufacturing the amplifier according to a one embodiment of the invention.

FIG. 5 illustrates a method of manufacturing the amplifier according to a one embodiment of the invention. In step 510, an input transformer with a first impedance transforming ratio is provided. In step 520, an amplification circuit and an output transformer with a second impedance transforming ratio are provided. In step 530, a coupled line structure is utilized to implement the input transformer, the output transformer, or both. In step 540, either the first impedance transforming ratio or the second impedance transforming ratio is selectively modified by changing either the structure of the coupled line transformer, employing offsetting lines, or both.

According to one embodiment of the invention, the power amplifier is implemented in a monolithic microwave integrated circuit (MMIC). According to another embodiment of the invention, the power amplifier is utilized in a radio transmitter.

In the foregoing specification, the invention has been described with reference to specific embodiments thereof. It will, however, be evident that various modifications and changes may be made thereto without departing from the broader scope of the invention. The specification and drawings are, accordingly, to be regarded in an illustrative rather than a restrictive sense.

What is claimed is:

1. A monolithic amplifier comprising:
   an input transformer with a first impedance transforming ratio; wherein the input transformer includes a coupled line structure;
   an amplification circuit coupled to the input transformer; and
   an output transformer with a second impedance transforming ratio, wherein the input transformer is implemented with a three-line micro strip structure, and the output transformer is implemented with a two-line micro strip structure.

2. The amplifier of claim 1 wherein the first impedance transforming ratio is a one to four ratio.

3. The amplifier of claim 1 wherein the second impedance transforming ratio is a one to one ratio.

4. The amplifier of claim 1 wherein the input transformer includes a micro-strip line structure that includes a first line, a second line and a third line.

5. The amplifier of claim 4 wherein the first line, a second line and a third line are generally arranged in a planar fashion in a first predetermined plane.

6. The amplifier of claim 4 wherein the first line, a second line and a third line are generally arranged in a broadside fashion; wherein each line is disposed in a different plane.

7. The amplifier of claim 6 wherein at least one of the lines is offset with respect to at least one of the other lines.

8. The amplifier of claim 1 wherein the output transformer includes a micro-strip line structure that includes a first line and a second line.

9. The amplifier of claim 8 wherein the first line and the second line are generally arranged in a planar fashion in a first predetermined plane.

10. The amplifier of claim 8 wherein the first line and the second line are generally arranged in a broadside fashion; wherein each line is disposed in a different plane.

11. The amplifier of claim 10 wherein the first line is offset with respect to the second line.

12. The amplifier of claim 1 wherein one of the input transformer and the output transformer includes offsetting conductor lines that can be utilized to adjust one of a first impedance transforming ratio and a second impedance transforming ratio.

13. The amplifier of claim 1 includes a coupled line structure operative to adjust one of the input transformer with the first impedance transforming ratio and the output transformer with the second impedance transforming ratio.

14. The amplifier of claim 1 wherein the amplifier is implemented in a monolithic microwave integrated circuit (MMIC).

15. The amplifier of claim 1 wherein the amplifier is utilized in a radio transmitter.

16. The amplifier of claim 1 wherein the amplification circuit includes a first field effect transistor and a second field effect transistor.

* * * * *